United States Patent [19]

Highnote et al.

[11] 4,024,462
[45] May 17, 1977

[54] DARLINGTON CONFIGURATION HIGH FREQUENCY DIFFERENTIAL AMPLIFIER WITH ZERO OFFSET CURRENT

[75] Inventors: Jerry Lee Highnote; Richard Lewis O'Day, both of Boulder, Colo.

[73] Assignee: International Business Machines Corporation, Armonk, N.Y.

[22] Filed: May 27, 1975

[21] Appl. No.: 580,980

[52] U.S. Cl. .............................. 330/25; 330/30 D
[51] Int. Cl.² ............................................ H03F 3/45
[58] Field of Search ............ 330/30 D, 69, 85, 25

[56] References Cited

UNITED STATES PATENTS

| | | |
|---|---|---|
| 3,126,490 | 3/1964 | Stern .................... 307/88.5 |
| 3,168,708 | 2/1965 | Stuart-Williams et al. ......... 330/22 |
| 3,213,203 | 10/1965 | Geyger ..................... 179/100.2 |
| 3,241,082 | 3/1966 | Van Ligten et al. ............. 330/19 |
| 3,263,177 | 7/1966 | Durrett ......................... 330/9 |
| 3,274,509 | 9/1966 | Brown ......................... 330/116 |
| 3,287,652 | 11/1966 | Erickson ...................... 330/14 |
| 3,289,094 | 11/1966 | Young ......................... 330/69 |
| 3,371,286 | 2/1968 | Lovelace ..................... 330/123 |
| 3,399,357 | 8/1968 | Weilerstein ............... 330/30 D X |
| 3,419,809 | 12/1968 | Lach et al. .................... 330/10 |
| 3,466,560 | 9/1969 | Kleinberg ..................... 330/30 |
| 3,480,872 | 11/1969 | Breuer ........................ 330/30 |
| 3,497,882 | 2/1970 | Beurrier ...................... 330/25 |
| 3,512,171 | 5/1970 | Hibner ........................ 346/74 |
| 3,519,848 | 7/1970 | Vercellotti .................. 330/30 D X |
| 3,533,007 | 10/1970 | Segar ........................ 330/30 D |
| 3,663,806 | 5/1972 | Drankhan et al. ............. 235/151.32 |
| 3,681,703 | 8/1972 | Johnson ........................ 330/9 |
| 3,684,971 | 8/1972 | Winkel ....................... 330/30 D |
| 3,688,209 | 8/1972 | Winkel ....................... 330/30 D |
| 3,700,922 | 10/1972 | Furman ........................ 307/246 |
| 3,719,833 | 3/1973 | Free .......................... 307/296 |
| 3,803,505 | 4/1974 | Ishigaki et al. ................ 330/29 |

OTHER PUBLICATIONS

"Matching Fets by Design is Faster and Cheaper than by Pick and Choose," Electronics, Dec. 8, 1969, pp. 114–116.

Primary Examiner—James B. Mullins
Attorney, Agent, or Firm—Pennie & Edmonds

[57] ABSTRACT

A differential amplifier comprises a pair of Darlington configuration amplifier halves operating in the Class A mode. Each Darlington half is provided with a feedback, difference amplifier, which functions as an analog comparator, and an emitter current control resistor to precisely control the emitter current and thereby to control the idling or quiescent current passing through a load in the collector circuit. Each difference amplifier is connected to its respective half by coupling one of its two inputs to the control resistor in the Darlington emitter circuit and coupling the other input to a source of reference voltage. The respective emitter current control resistors are precisely matched. In operation, the output of each difference amplifier drives the base circuit of its respective Darlington half. The difference amplifier maintains the voltage at the terminal of the emitter current control resistor at a value substantially equal to the reference voltage, thereby biasing the Darlington half at a constant value representative of emitter current. Because the control resistors are precisely matched, the emitter currents are equal; and, because the gain of the Darlington halves is very high, the load or collector currents are substantially equal to the respective emitter currents and to one another. Thus, a load driven by both collector circuits is provided with a substantially zero d.c. offset current.

25 Claims, 1 Drawing Figure

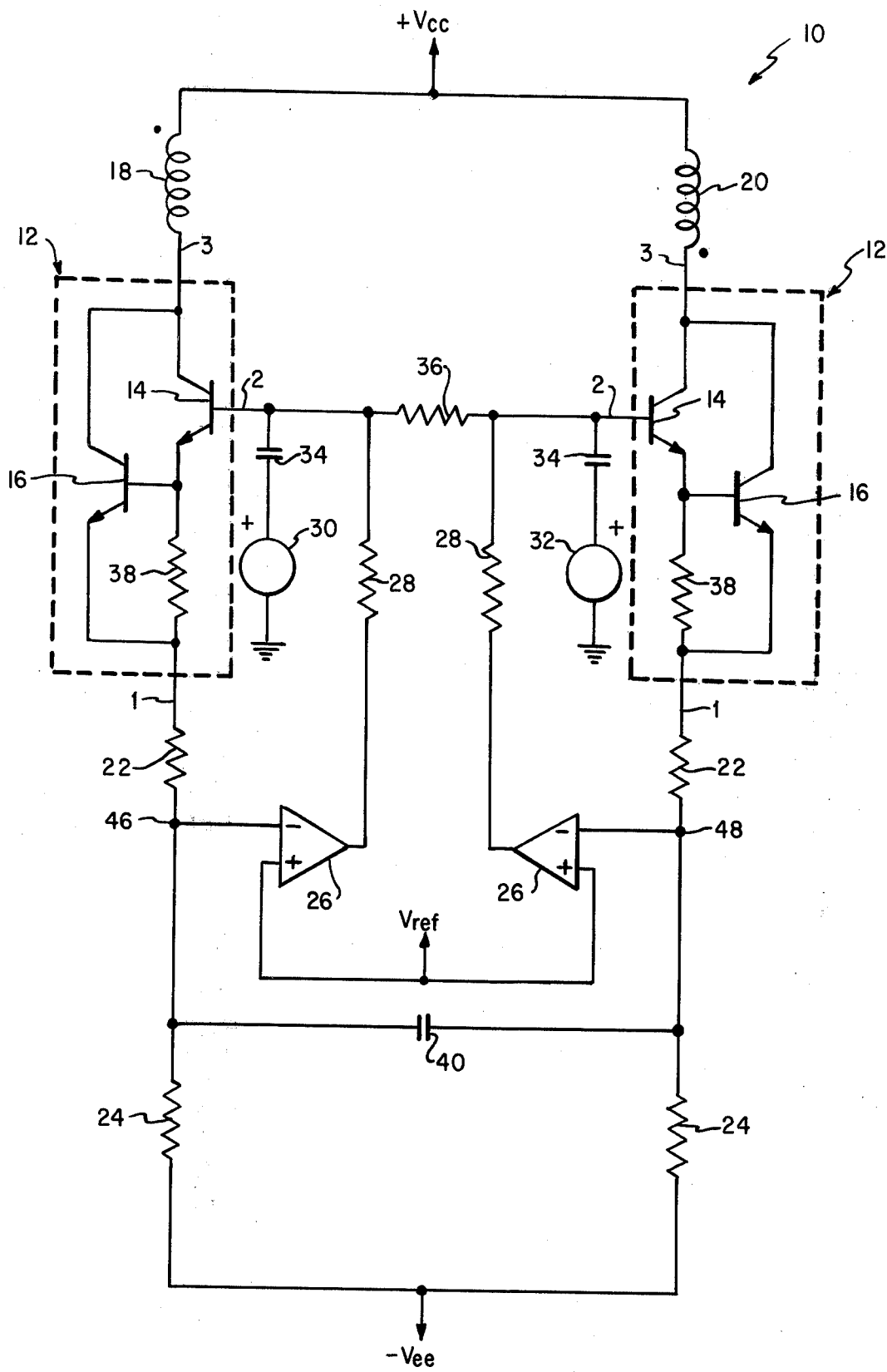

DARLINGTON CONFIGURATION HIGH FREQUENCY DIFFERENTIAL AMPLIFIER WITH ZERO OFFSET CURRENT

BACKGROUND OF THE INVENTION

The present invention is a differential transconductance amplifier which is particularly useful for driving a load at high frequencies while maintaining a low level of d.c. offset current.

Because of their relatively low distortion characteristics, differential amplifiers using Class A amplifier halves are particularly useful in the magnetic recording art. Such a differential amplifier typically comprises a pair of Class A transistor amplifier halves coupled together in a symmetrical, differential configuration. In operation, it amplifies the difference between a pair of input signals and uses the amplified difference to drive a load, typically a magnetic recording head. Such differential amplifiers have proven satisfactory in relatively low speed recording systems.

In high speed recording systems, however, these amplifiers present difficulties in the form of a d.c. offset current which have not heretofore been satisfactorily overcome. The offset current derives from operation of the Class A amplifier halves. Even when a Class A amplifier is not being driven, an idling or quiescent current will pass through any load to which it is connected. This idling current can drive a magnetic recording head to generate a magnetic field and to record a d.c. level even when no information signal is presented at the input.

In relatively low speed recording systems, the magnetic field generated by the idling current may be cancelled to a substantial extent by the use of a two-coil head and two matched Class A amplifiers. By using substantially identical coils and matched transistor amplifiers having substantially identical idling currents, the system can be designed so that the two idling currents pass through identical paths in opposite directions resulting in a low-level of d.c. offset current.

This solution, however, is expensive and difficult to achieve in high frequency recording systems. This is so because, as the frequency increases, the component parts of the amplifiers must be matched with increasing accuracy. Typically this matching problem may be solved to a limited extent by providing the amplifier with a pair of high frequency transistors each having a high gain and a high frequency response. However, such transistors are expensive and difficult to match. Moreover, they may change their relative characteristics with the passage of time or even with variations in temperature. For this reason, such circuits have been successfully used only with relatively low frequency signals.

SUMMARY OF THE INVENTION

In accordance with the invention, a differential amplifier comprises a pair of Darlington configuration amplifier halves operating in the Class A mode. Each half is provided with a feedback, difference amplifier and an emitter current control resistor to precisely control the emitter current and thereby to control the idling current passing through a load in the collector circuit. Each difference amplifier is connected to its respective half by coupling one of its two inputs to the control resistor in the Darlington emitter circuit and coupling the other input to a source of reference voltage. The respective emitter current control resistors are precisely matched.

In operation, the output of each difference amplifier drives the base circuit of its respective Darlington half. The difference amplifier maintains the voltage at the terminal of the emitter current control resistor at a value substantially equal to the reference voltage, thereby biasing the Darlington half at a constant value representative of emitter current. Because the control resistors are precisely matched, the emitter currents are equal; and because the current gain of the Darlington halves is very high, the load or collector currents are substantially equal to the respective emitter currents and to one another. Thus, a load driven by both collector circuits is provided with a substantially zero d.c. offset current.

BRIEF DESCRIPTION OF THE DRAWING

The nature, advantages, and various features of the invention will appear more fully upon consideration of the illustrative embodiments now to be described in detail in connection with the accompanying drawing which is a schematic diagram of an an amplifier in accordance with the invention.

For convenience of reference, components performing identical functions in different halves of this highly symmetrical circuit are given the same numerical designations.

DETAILED DESCRIPTION OF THE DRAWING

The FIGURE illustrates a preferred embodiment of a differential amplifier 10 comprising a pair of amplifier halves 12 in a symmetrical, differential configuration. These amplifier halves have first and second output terminals at junctions, 1 and 3, respectively, for connection to an output path and a control terminal at junction 2. The amplifiers are chosen or adapted to have a sufficiently high current gain, typically in excess of about 1500, that the magnitude of the current from the first output terminal is substantially equal to the magnitude of the current from the second output terminal. Preferably these halves comprise Darlington amplifiers.

Each high gain amplifier half 12 can be a Class A Darlington amplifier comprising, for example, a pair of junction transistors, such as driving transistor 14, a driven power transistor 16, and a shunt resistor 38. The collectors of transistors 14 and 16 are connected together. The emitter of each driving transistor 14 is connected to the base of its respective driven transistor 16. The emitter of driven transistor 16 is connected to its base by shunt resistor 38.

Transistors in the configuration illustrated in each shunted Darlington half 12 behave in a manner similar to a single transistor amplifier having a gain equal to the product of the gains of transistor 14 and transistor 16. The first output terminal at junction 1 can be considered the Darlington emitter; the control terminal at junction 2, can be considered the Darlington base; and the second output terminal at junction 3, the Darlington collector.

Loads 18 and 20 are disposed in the collector circuits of the respective Darlington halves between the Darlington collector 3 and a source of positive voltage, $+V_{cc}$. Loads 18 and 20 may comprise, for example, the two coils of a magnetic recording head.

Each Darlington emitter circuit is completed by the series combination of a resistor 22 and an emitter current control resistor 24 connected between Darlington emitter terminal 1 and a source of relatively negative d.c. voltage, $-V_{ee}$. The emitter current control resistors 24 of each respective half are precision resistors matched to equalize the currents flowing into the respective Darlington emitters.

Each shunted Darlington half 12 is biased at the Darlington base 2 ny high-voltage-gain difference amplifier 26. The output of amplifier 26 is connected by resistor 28 to the base of the driving transistor 14. Each difference amplifier 26 forms part of a feedback loop between the emitter circuit and base circuit of its respective Darlington half 12. One input of each amplifier 26 is connected to the junction of resistors 22 and 24 while the other input is connected to a source of reference voltage, $V_{ref}$.

Typically, the differential amplifier 10 is driven by a pair of input sources 30 and 32 coupled through respective capacitors 34 to the Darlington bases 2 at the bases of respective driving transistors 14. For high frequency operation, a termination impedance, such as resistor 36, is connected between the respective Darlington bases 2 in order to terminate driving sources 30 and 32 with a matched impedance and thereby to prevent reflections and other types of distortion. The value of resistance 36 is preferably chosen to equal the differential impedance of the input lines from sources 30 and 32.

Differential operation is provided by coupling the respective Darlington emitter circuits through capacitor 40, which is connected between the respective junctions 46 and 48 of resistors 22 and 24 in each of the emitter circuits of the two Darlington halves 12.

D.C. OPERATION

In operation, difference amplifier 26 and control resistor 24 cooperate to equalize the current applied to the emitter circuits of each Darlington half. Because the gain of each Darlington half is great (typically in excess of 1500), current in the Darlington base is negligible, and the resulting collector currents are substantially equal to the emitter currents and to one another. The advantageous consequence of this arrangement is that substantially zero offset current is drawn by loads in the collector circuits. The zero offset current is achieved by the cooperative use of the feedback networks and the high gain Darlington halves.

The difference amplifier 26 acts to maintain the voltage of the junctions of resistors 22 and 24 at a level substantially equal to the reference voltage, $V_{ref}$, and to one another. The application of a reference voltage to the positive terminal of difference amplifier 26 causes a control voltage to appear at the base of transistor 14. This voltage causes an emitter current to flow in the emitter of transistor 14 and through the base of transistor 16, and this emitter current, in turn, causes transistor 16 to pass its own emitter current through resistors 22 and 24, generating voltage representative of emitter current at the junction of these resistors.

The junction of resistors 22 and 24 is coupled to the negative terminal of difference amplifier 26. And since the amplifier has a very high gain, only a few millivolts difference between the positive and negative terminals are necessary to saturate it. As a consequence, the amplifier 26 stabilizes with an output voltage which maintains the voltage at junctions 46 and 48 at a value within a few millivolts of the reference voltage, $V_{ref}$.

Precision matched emitter current control resistors 24 cooperate with the difference amplifier 26 to insure that substantially equal currents are applied to each Darlington emitter. Because neither amplifier 26 nor capacitor 40 draw appreciable d.c. current, the current flowing into each Darlington emitter is that passing through emitter current control resistors 24. Because the control resistors 24 are precisely matched and are each connected between substantially equal voltages, substantially equal currents pass through them to the Darlington emitters.

The high gain Darlington amplifiers 12, in this arrangement, insure that substantially equal collector currents will pass through loads 18 and 20, thereby securing substantially zero offset current. Because of the very high gain of each Darlington half, the current flowing in the collector circuit is substantially equal to the current which passes through the emitter. And because the current flowing into the emitters of each Darlington half are made substantially equal by difference amplifier 26 and control resistor 24, the result is that the collector currents passing through loads 18 and 20 are substantially equal in magnitude, producing zero offset current. In a magnetic recording head loads 18 and 20 are inductors wound in opposite directions. As a result, no net magnetic flux is developed in the recording head in the absence of an information signal to be recorded.

In the atypical case where the two coils of the magnetic recording head have a different number of turns, zero offset current can still be attained by proportionately increasing the d.c. current through the smaller coil, so that no net magnetic flux is produced.

A.C. OPERATION

Differential amplifier 10 is driven by a pair of voltage sources 30 and 32. Its operation may be described quantitatively by noting that the voltage drops across base-to-emitter junctions of transistors 14 and 16 are negligible compared to the a.c. voltage from source 30 or 32. Accordingly substantially all of the a.c. voltage from sources 30 and 32 appears at the Darlington emitters 1. Although voltage gain across each Darlington amplifier 12 from base 2 to emitter 1 is essentially one, the current gain is very high.

The operation of the shunted Darlington half is similar in many respects to the operation of a conventional Darlington amplifier. The addition of shunt resistor 38 to the conventional Darlington configuration results in a significant improvement in the high frequency operation of each amplifier for two reasons. First, resistor 38 serves as a discharge path for the capacitance which is inherent in the junction between the base and emitter of transistor 16.

A second advantage of shunt resistor 38 is that it improves the frequency response of amplifier 10 by causing a current to pass through the emitter-collector circuit of transistor 14. The frequency response of transistor 14 increases with increasing collector current. The presence of resistor 38 in the emitter circuit of transistor 14 increases its collector current, and thereby enhances the frequency response.

In selecting resistor 38 one should consider its tendency to couple a.c. signals from the emitter of transistor 14 directly to the emitter of the shunted Darlington half. As there a.c. signals would otherwise be coupled to the base of transistor 16, resistor 38 thus reduces the gain of the shunted Darlington half. However, insofar as the gain of the shunted Darlington half is very high, this in not a serious problem and the amplifier will work well even in a situation where resistor 38 is diverting as much as about 20 percent of the emitter current of transistor 14 away from transistor 16.

The differential amplifier of the invention is particularly advantageous for use in the typical application where the driving sources 30 and 32 develop signals which are equal in magnitude by 180° out of phase with respect to each other. In this application, the effective gain of the amplifier is relatively greater for the 180° out-of-phase signals than it is for spurious signals which are not 180° out of phase. One can appreciate this result by noting that the output of each shunted Darlington half drives both the emitter circuit and the collector circuit and that the impedance of the emitter circuit is at a minimum value for driving signals which are 180° out-of-phase. Such signals cancel at coupling capacitor 40, effectively placing junctions 46 and 48 at a.c. ground and minimizing impedance in the emitter circuit by shorting resistors 24 to a.c. ground. Thus, a high proportion of the amplifier output is dissipated in the Darlington collector circuit which bears the load. Spurious signals which are not 180° out-of-phase do not cancel at the coupling capacitor 40; and, as a result, they encounter a relatively greater impedance in the emitter circuit, thereby reducing the amount of power transmitted to the load-bearing collector circuit.

Although differential amplifier 10 may be fabricated in various configurations with components of many different values and types, a suitable amplifier may be fabricated by using the listed components for the various elements in the above-described circuit:

Transistors 14 — 2N5852
Transistors 16 — 2N5109
Capacitors 34 — 1200pF
Resistors 38 — 28 ohms
Resistor 36 — 150 ohms or the output impedance of sources 30 and 32
Resistor 28 — 2.8 Kilohms
Rsistors 22 — 10 ohms
Capacitor 40 — 1200 pF
Resistors 24 — 31 ohms.

While a preferred embodiment of the invention has been illustrated, it is understood that various modifications of the above-described circuit will be obvious to one of ordinary skill in the art. For example, the shunted Darlington pair may be fabricated with any number of different control devices in place of the NPN junction transistors illustrated in the preferred embodiment. Thus, one could choose to employ PNP transistors without changing the nature or the operation of the circuit. It is also possible to employ field effect devices or even fluidic devices. Such obvious modifications are within the spirit and scope of the invention as defined and limited only by the appended claims.

We claim:

1. A symmetric differential amplifier comprising:
a pair of amplifiers each having an emitter terminal, a collector terminal, and a base terminal, each of said amplifiers having a sufficiently high gain that its collector current is substantially equal to its emitter current;
means for capacitively coupling the emitter currents of said pair of amplifiers together;
feedback means responsive to the respective emitter currents coupled between the emitter terminal and the base terminal of each of said amplifiers for applying to each of said respective base terminals a bias voltage corresponding to substantially equal emitter currents in both of said amplifiers;
precision resistance means in the emitter circuit of each of said pair of amplifiers matched to equalize the current flowing into the emitters of both amplifiers of said pair;
means for receiving signals to be differentially amplified at each of said respective base terminals;
and a load coupled between the collector terminals of said amplifiers for receiving the amplified difference between said signals.

2. A differential amplifier according to claim 1 wherein each amplifier of said pair of amplifiers is a Darlington configuration amplifier.

3. A differential amplifier according to claim 2 wherein each amplifier of said pair of amplifiers is a two-transistor, Darlington configuration amplifier comprising a first transistor having its collector connected to the collector of a second transistor and having its emitter connected to the base of the second transistor.

4. A differential amplifier according to claim 3 wherein the base of said second transistor is connected to its emitter by a shunt resistor.

5. A differential amplifier according to claim 2 wherein each said feedback means comprises a difference amplifier, resistive means, and a reference voltage source.

6. A differential amplifier according to claim 5 wherein said coupling means are connected between an input to the difference amplifiers in said feedback means.

7. A differential amplifier according to claim 2 wherein a pair of sources for generating signals equal in magnitude and 180° out of phase are coupled to said means for receiving signals.

8. A differential amplifier according to claim 2 wherein a pair of sources for generating signals are coupled to said means for receiving signals and said means for receiving signals are connected by impedance means for matching the output impedance of said sources for generating signals.

9. A differential amplifier according to claim 2 wherein said load coupled between the said collector terminals of said amplifiers comprises a pair of wire coils for a magnetic recording head.

10. A differential amplifier, comprising:
a. a first half comprising first and second control devices, each control device having first and second terminals for connection to an output path, and a control terminal, said first terminal of said first control device being coupled to said first terminal of said second control device, and said second terminal of said first control device being coupled to the control terminal of said second control device;
b. a second half comprising third and fourth control devices, each control device having first and second terminals for connection to an output path, and a control terminal, said first terminal of said third control device being coupled to said first terminal of said fourth control device, and said second terminal of said third control device being coupled to the control terminal of said fourth control device;
c. a first source of constant potential;

d. first precision resistance means having first and second terminals, the first terminal of said first precision resistance means being coupled to the second terminal of said second control device, and the second terminal of said first precision resistance means being coupled to said first source of constant potential;

e. second precision resistance means having first and second terminals, the first terminal of said second precision resistance means being coupled to the second terminal of said fourth control device, and the second terminal of said second precision resistance means being coupled to said first source of constant potential;

f. a second source of constant potential;

g. first feedback means responsive to the voltage across said first precision resistance means, and said second source of constant potential, said first feedback means being coupled to the control terminal of said first control device to control the quiescent conditions in said first half;

h. second feedback means responsive to the voltage across said second precision resistance means and said second source of constant potential said second feedback means being coupled to the control terminal of said third control device to control the quiescent conditions in said second half;

i. capacitive coupling means connected between said first terminals of said first and second precision resistance means; and j. means for coupling signals to the control terminal of said first control device and the control terminal of said third control device, whereby the difference between said signals will be amplified and loads connected between a third source of constant potential and the first terminals of said second and fourth control devices will be driven by said amplified difference signal.

11. A differential amplifier as in claim 10, wherein each of said control devices is an electronic control device.

12. A differential amplifier as in claim 12, wherein each of said electronic control devices is a transistor.

13. A differential amplifier as in claim 12, wherein each of said transistors is a junction transistor.

14. A differential amplifier as in claim 10, wherein a first shunt resistance means is connected between the control terminal and the second terminal of said second control device; and a second shunt resistance means in connected between the control terminal and the second terminal of said fourth control device.

15. A differential amplifier as in claim 14, wherein the first terminal of each of said control devices is the collector of a junction transistor, the second terminal is the emitter of the transistor and the control terminal is the base of the transistor and wherein the first terminal of said first precision resistance means is coupled to the emitter of the second transistor by a first emitter resistance and the first terminal of said second precision resistance means is coupled to the emitter of the fourth transistor by a second emitter resistance.

16. A differential amplifier as in claim 15, wherein said first and second difference amplifiers are coupled to the junction of said first emitter resistance and said first precision resistance means, and the junction of said second emitter resistance and said second precision resistance means, respectively.

17. A differential amplifier as in claim 10, including matching impedance means connected between the base of said first junction transistor and the base of said third junction transistor.

18. A differential amplifier as in claim 17, wherein said first feedback means comprises:
a first difference amplifier having its output coupled to the base of said first junction transistor and having inputs coupled to said first terminal of said first precision resistance means and said second source of constant potential; and said second feedback means comprises:
a second difference amplifier having its output coupled to the base of said third junction transistor and having inputs coupled to said first terminal of said second precision resistance means and said second source of constant potential.

19. A differential amplifier as in claim 10 wherein an input to said feedback means is connected to the first terminals of said first and second precision resistance means.

20. A symmetric differential amplifier for driving a load connected in its output path with a substantially zero d.c. off-set current comprising:
a pair of amplifiers each having first and second output terminals for connection to an output path and a control terminal, each of said amplifiers having a gain sufficiently high that the current from the first output terminal of each of said amplifiers is substantially equal in magnitude to the current from its respective second terminal;
means for capacitively coupling together currents from the first output terminal of each of said amplifiers;
precision resistance means in the path of current from the first output terminal of each amplifier matched to equalize the current from the first output terminals of each of said amplifiers;
feedback means responsive to the currents from the respective first output terminals and coupled between the first output terminal and the control terminal of each of said amplifiers for applying to each of said respective control terminals a bias voltage corresponding to substantially zero d.c. off-set current in said load; and
means for receiving signals to be differentially amplified at each of said respective control terminals.

21. A differential amplifier as in claim 20, wherein each amplifier of said pair of amplifiers comprises a transistor amplifier, the first output terminal of each of said amplifiers being the emitter of said transistor amplifier, the second output terminal being the collector of said transistor amplifier and the control terminal being the base of said transistor amplifier.

22. A differential amplifier according to claim 20 wherein each amplifier is a Darlington configuration amplifier.

23. A differential amplifier according to claim 20 wherein each amplifier of said pair of amplifiers is a two-transistor, Darlington configuration amplifier comprising a first junction transistor having its collector connected to the collector of a second junction transistor and having its emitter connected to the base of the second transistor.

24. A differential amplifier according to claim 23 wherein in each of the two-transistor Darlington configuration amplifiers, the base of the second junction transistor is connected to its emitter by a shunt resistor.

25. A method for driving with a substantially zero d.c. off-set current a load connected in the output path of a symmetric differential amplifier of the type comprising a pair of amplifiers, each amplifier having a pair of output terminals and a control terminal, said method comprising the steps of:

providing each amplifier of said pair of amplifiers with a sufficiently high gain that the currents from its respective output terminals are substantially equal in magnitude;

capacitively coupling together currents from an output terminal of each amplifier;

generating a pair of precision voltages proportional to the current flowing from each of said output terminals;

comparing said precision voltages to a reference voltage to generate a pair of bias signals corresponding to substantially zero d.c. off-set current in said load;

applying to each of said control terminals the bias signal generated in response to its respective output terminal current; and applying to each of said control terminals input signals to be differentially amplified and used for driving said load.

* * * * *

UNITED STATES PATENT AND TRADEMARK OFFICE
CERTIFICATE OF CORRECTION

PATENT NO. : 4,024,462
DATED : May 17, 1977
INVENTOR(S) : Jerry Lee Highnote and Richard Lewis O'Day It is certified that error appears in the above-identified patent and that said Letters Patent are hereby corrected as shown below:

In "References Cited", line 16, correct "3,497,882" to -- 3,497,822 --.

Column 1, lines 35 and 36, correct "two-coil head" to -- two-coil recording head --.

Column 2, line 23, correct "an an" to -- an --.

Column 3, line 8, correct "ny" to -- by --.

Column 3, line 26, correct "resistance 36" to -- resistor 36 --.

Column 4, line 66, correct "there" to -- these --.

Column 5, line 9, correct "by" to -- but --.

Column 5, line 41, correct "Rsistors 22" to -- Resistors 22 --.

Column 7, line 42, change "Claim 12" to -- Claim 11 --.

UNITED STATES PATENT OFFICE
CERTIFICATE OF CORRECTION

Patent No. 4,024,462          Dated May 17, 1977

Inventor(s) Jerry Lee Highnote and Richard Lewis O'Day

It is certified that error appears in the above-identified patent and that said Letters Patent are hereby corrected as shown below:

Column 7, line 50, "means in" should read -- is --.

Signed and Sealed this

Twentieth Day of September 1977

[SEAL]

Attest:

RUTH C. MASON  
*Attesting Officer*

LUTRELLE F. PARKER  
*Acting Commissioner of Patents and Trademarks*